United States Patent
Ahmad

(10) Patent No.: US 7,403,433 B2
(45) Date of Patent: Jul. 22, 2008

(54) SELF TIMING WRITE ARCHITECTURE FOR SEMICONDUCTOR MEMORY AND METHOD FOR PROVIDING THE SAME

(75) Inventor: Nasim Ahmad, Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 11/617,234

(22) Filed: Dec. 28, 2006

(65) Prior Publication Data

US 2007/0165463 A1     Jul. 19, 2007

(30) Foreign Application Priority Data

Dec. 30, 2005   (IN)   ................ 3553/DEL/2005

(51) Int. Cl.
*G11C 7/00*   (2006.01)
(52) U.S. Cl. .................................. 365/189.09; 365/210
(58) Field of Classification Search ................ None
See application file for complete search history.

(56) References Cited

U.S. PATENT DOCUMENTS 5,596,526 A * 1/1997 Assar et al. ............ 365/185.17
6,522,567 B2 * 2/2003 Iwanari ....................... 365/145

* cited by examiner

*Primary Examiner*—Tan T. Nguyen
(74) *Attorney, Agent, or Firm*—Lisa K. Jorgenson; Dennis M. de Guzman; Seed IP Law Group PLLC

(57) ABSTRACT

A self timing write architecture for semiconductor memory and a method for providing the same are provided. The core region of the semiconductor memory comprises of a normal memory cell array and a dummy column. The dummy column comprises of two blocks—block A and block B. Block A is composed of a cluster of N dummy cells in which data is written during write operation. The remaining cells in the dummy column together form block B which is meant for providing load for the dummy bit line. During a write operation, a dummy word line is generated to enable dummy memory cells of block A. The dummy bit line is then made to travel half the number of rows in the normal memory array and then made to return back. A dummy data is then written in all the dummy cells in block A. Simultaneously, a normal memory cell is also accessed and actual data is written into it. As soon as the writing operation is complete, a W-reset signal is generated to indicate successful completion of write operation. Recovery operation for the next cycle is then started.

27 Claims, 2 Drawing Sheets

ADDRESS/CONTROL SIGNALS        INPUT/OUTPUT SIGNALS

SELF TIMING WRITE ARCHITECTURE FOR SEMICONDUCTOR MEMORY AND METHOD FOR PROVIDING THE SAME

TECHNICAL FIELD

The present disclosure generally relates to self timing write architecture for semiconductor memory device.

BACKGROUND INFORMATION

A typical semiconductor memory comprises of a large number of memory cells arranged in an array of rows and columns. Each memory cell is capable of storing therein a binary digit, a binary "one" or a binary "zero". Each row of the memory cell array is typically connected to a word line and each column of the memory cell array is typically connected to a pair of bit lines. Read and write operations are performed on an individual memory cell by addressing the appropriate row of the array using the word lines and addressing the appropriate cell in the addressed row using the bit lines. Depending upon the signals applied to the bit lines, a read operation may be performed for accessing binary data stored in the addressed memory cell or write operation may be performed for storing binary data in the addressed memory cell. In order to ensure that the read and write operations are properly performed, a time delay is present between the accessing of memory cell and read/write operation. As a result of this, a delay circuit is incorporated in almost all memory devices used at present. This delay circuit provides a timing delay to enable successful read and write operations in the memory device. In particular, for the case of writing data into a memory cell, this timing delay corresponds to the time required for a written memory cell to stabilize. The required time delay can be determined if the memory structure and its likely behavior is well known. However, the memory behavior depends on many factors such as memory size and PVT (process voltage and temperature conditions). Moreover, since different process tolerances are involved in the manufacture of memories, this means that any two memories may not have identical behavior. Therefore, the time delay required for proper functioning of a memory device cannot be predetermined.

To overcome the above mentioned problems, the concept of 'dummy cells' has been successfully used in semiconductor memory devices. These cells are provided in the memory region of the semiconductor device and have same structure as the actual memory cells. As a result, it takes same time for writing data into dummy cell as taken in the case of normal memory cell. This fact can be exploited to make the timing circuit responsive to the operating conditions of the memory.

In one of the configurations commonly used, the memory device is provided with a column of dummy cells. Dummy data is written in one of these dummy cells whereas other dummy cells are kept inactive for the purpose of loading. During the write operation, this dummy cell is accessed and data is written into it by a write driver. Simultaneously, in the memory array, a normal memory cell is accessed and data is written into it by another write driver. As soon as the voltage in the written dummy cell rises to the voltage corresponding to the written data, a write reset (W-reset) signal is initiated to indicate successful completion of write operation. The recovery operation for the next cycle starts in response to this signal.

However, since in this configuration dummy data is written only in one dummy cell, the self timing of the device depends almost entirely on the behavior of this dummy cell. Also, there is a mismatch between behavior of a normal memory cell and dummy cell due to presence of load on the internal node of the dummy cell.

BRIEF SUMMARY

There is therefore a need for improved self timing write architecture in which the behavior of normal memory cell and dummy cell matches perfectly during a write operation.

An embodiment of the present invention provides a semiconductor memory device with an improved self timing write architecture in which the behavior of normal memory cell and dummy cell matches perfectly during a write operation.

One embodiment of the present invention provides a semiconductor memory device with a control circuit, a decoder circuit, an input/output block, a memory core and logic for generating W-reset. The memory cells in the memory core are arranged in the form of rows and columns. One of the columns of the memory core is the dummy column. The rest of the columns are comprised of normal memory cells. Each row of the normal memory cell is connected to a normal word line and each column of the normal memory cells is connected to a pair of bit lines called normal bit lines. Similarly, a dummy bit line is connected to each of the cells of the dummy column. The cells in the dummy column are grouped into two blocks. A block comprising of N dummy cells is meant for writing dummy data whereas the rest of the cells are for the purpose of providing load. During writing operation, a dummy word line is generated to enable dummy memory cells. Dummy data is written in each of the N dummy cells meant for data writing. Simultaneously, a normal memory cell is also accessed and actual data is written into it. When the dummy data is correctly written in all the N dummy cells, a signal W-reset is generated to indicate successful completion of write operation. The recovery operation for the next cycle starts in response to this signal.

Since in this process, writing on many dummy cells occurs together, the variation in behavior of dummy cells due to process variations is averaged out. For example, if writing is done in N dummy cells, then the spread in variation reduces by a factor of $N^{1/2}$. Moreover, as a result of writing on many dummy cells, the load on the internal node is shared between all N dummy cells. Therefore, the dummy write behavior exactly matches the behavior of normal memory cell. As a result, write operation becomes robust.

One embodiment of the invention provides self timing write architecture for semiconductor memory device comprising:

- an array of normal memory cells arranged in rows and columns;
- at least one column of dummy cells, each column divided into two blocks of dummy cells for data writing and for providing load respectively;
- a write circuitry enabled by a write enable signal for carrying out memory write operation; and
- at least one logic circuit coupled to said dummy column for signaling the completion of writing into said dummy cells.

Further, an embodiment of the invention provides the method for self timing write architecture for semiconductor memory device comprising:

- arranging normal memory cells in an array of rows and clusters;
- providing at least one column of dummy cells, each column divided into two blocks of dummy cells for data writing and for providing load respectively;

generating dummy word line for enabling dummy cells in response to write enable signal;

making dummy bit line to travel number of rows equal to half the number of rows in normal memory array and then back;

writing data in all the dummy cells meant for writing;

simultaneously accessing a normal memory cell and writing actual data into it;

signaling the completion of write operation when all written dummy cells stabilize; and starting the recovery operation for next cycle.

BRIEF DESCRIPTION OF THE SEVERAL VIEWS OF THE DRAWINGS

Non-limiting and non-exhaustive embodiments of the present invention are described with the help of accompanying drawings.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
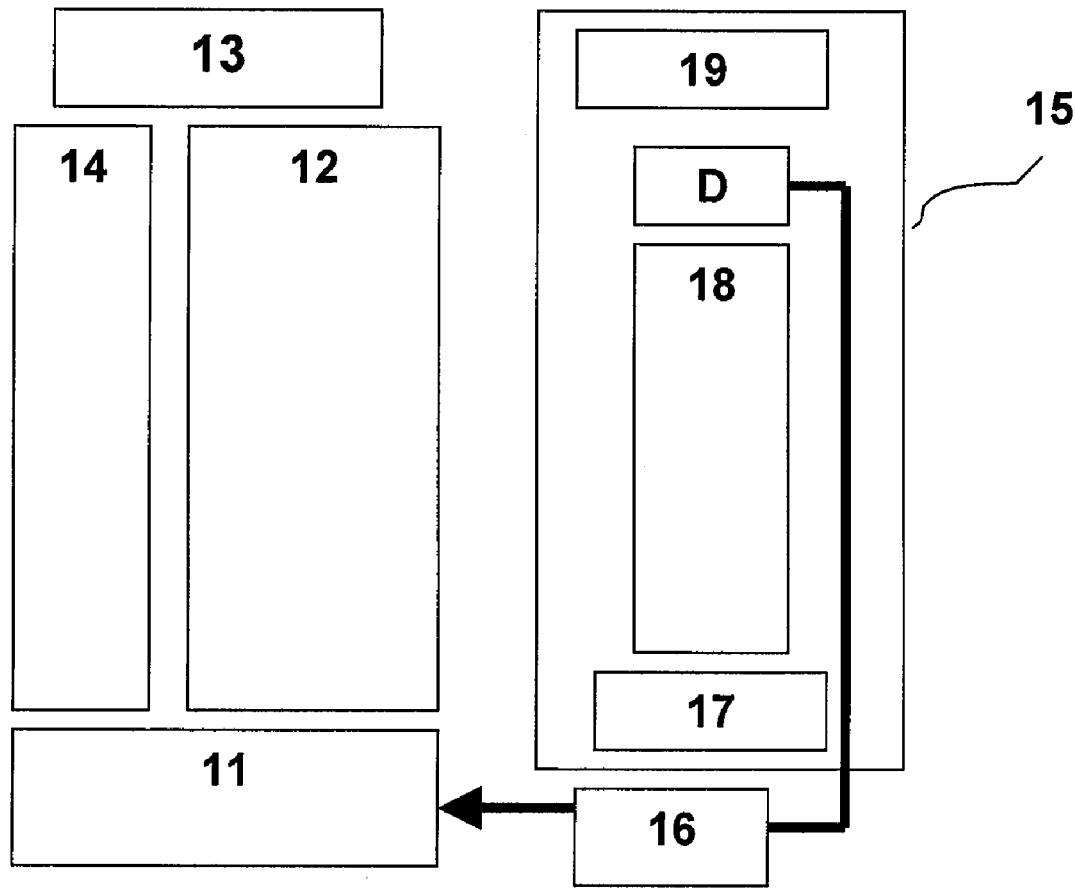
FIG. 1 shows a block diagram of a known semiconductor memory device.

FIG. 1 shows a block diagram of a known semiconductor memory device. The device comprises of a control circuit (11), a normal memory cell array (12), a write driver (13), a series of row drivers (14) having a row driver corresponding to each row of the normal memory cell array (12), a dummy circuit (15) and a logic for generating W-reset (16). The dummy circuit (15) in turn comprises of a dummy cell (D) for writing dummy data, a dummy row driver (17), a block of inactive dummy cells (18), and a dummy write driver (19). In the dummy column, only one dummy cell (D) is used for the purpose of writing. The rest of the dummy cells (18) are inactive. During write operation, the control circuit (11) generates a signal to enable the dummy row driver (17). At the same time, one of the row drivers is also enabled. The selected row driver drives the word line of the accessed row. The dummy write driver writes a predetermined state to the dummy cell (D). Simultaneously, actual data is written into a normal memory cell in the accessed row by write driver (13). As soon as the voltage in dummy cell (D) becomes equal to the voltage corresponding to the dummy data written, a reset is generated by reset generating circuit (16). This reset signal is sent to reset control circuit (11).

The above-described method is an efficient way of providing self timed write operation. However, it suffers from some drawbacks. Since, the W-reset signal is generated in response to write operation in dummy cell (D), the self timing of the device depends almost entirely on the behavior of this dummy cell (D). Since no two memory cells behave in a similar manner, this dependency on one dummy cell is not desirable. Moreover, writing behavior of a memory cell heavily depends on the internal node capacitance. Since the dummy cell (D) is connected to logic generating W-reset (16), there is a huge load on the internal node of the dummy cell (D). This creates a mismatch between behavior of a normal memory cell and dummy cell (D).

In order to overcome the drawbacks of the prior art, one or more embodiments of the present invention provides a semiconductor memory device with an improved self timed write architecture. The device of one embodiment is shown in the form of a block diagram in FIG. 2. It comprises a control circuit (21), a decoder circuit (22), a normal memory cell array (23), a dummy column (24), an input/output block (25), a dummy bit line (26), and logic for generating W-reset (27). The normal memory cell array (23) and the dummy column (24) together comprise the complete memory core of the semiconductor device.

The dummy column (24) comprises two blocks—block A and block B. Block A is composed of a cluster of N dummy cells in which data is written during write operation. The internal nodes of all these N dummy cells are shorted. The remaining cells in the dummy column together form block B which is meant for providing load for the dummy bit line (26). During write operation, the control circuit (21) receives address as well as control signals from exterior of the device. These control signals include write enable signal and the data to be written. In response to these signals, the control circuit (21) generates a local clock which is sent to the input/output block (25). The input/output (25) block in turn enables the write operation. Dummy word line is generated to enable dummy memory cells of block A. The dummy bit line is then made to travel half the number of rows in the normal memory array and then made to return back. A dummy data, either 'zero' or 'one' is then written in all the dummy cells in block A. Simultaneously, depending upon the address signal received by control circuit (21), a normal memory cell (M) is accessed and actual data is written into it. As soon as the voltage in all of the written dummy cells rises to the voltage corresponding to dummy data, a W-reset signal is generated by logic circuitry (27) to indicate successful completion of write operation. This signal is sent to the control circuit (21) which in turn starts the recovery operation for the next cycle.

Since in the present architecture, dummy bit line is made to travel only half the number of rows in the normal memory, this provides flexibility in choosing the number of cells in the dummy column (24). The dummy column (24) may have only half the number of rows present in the normal memory array. This saves memory area in the memory core.

Figure 2:
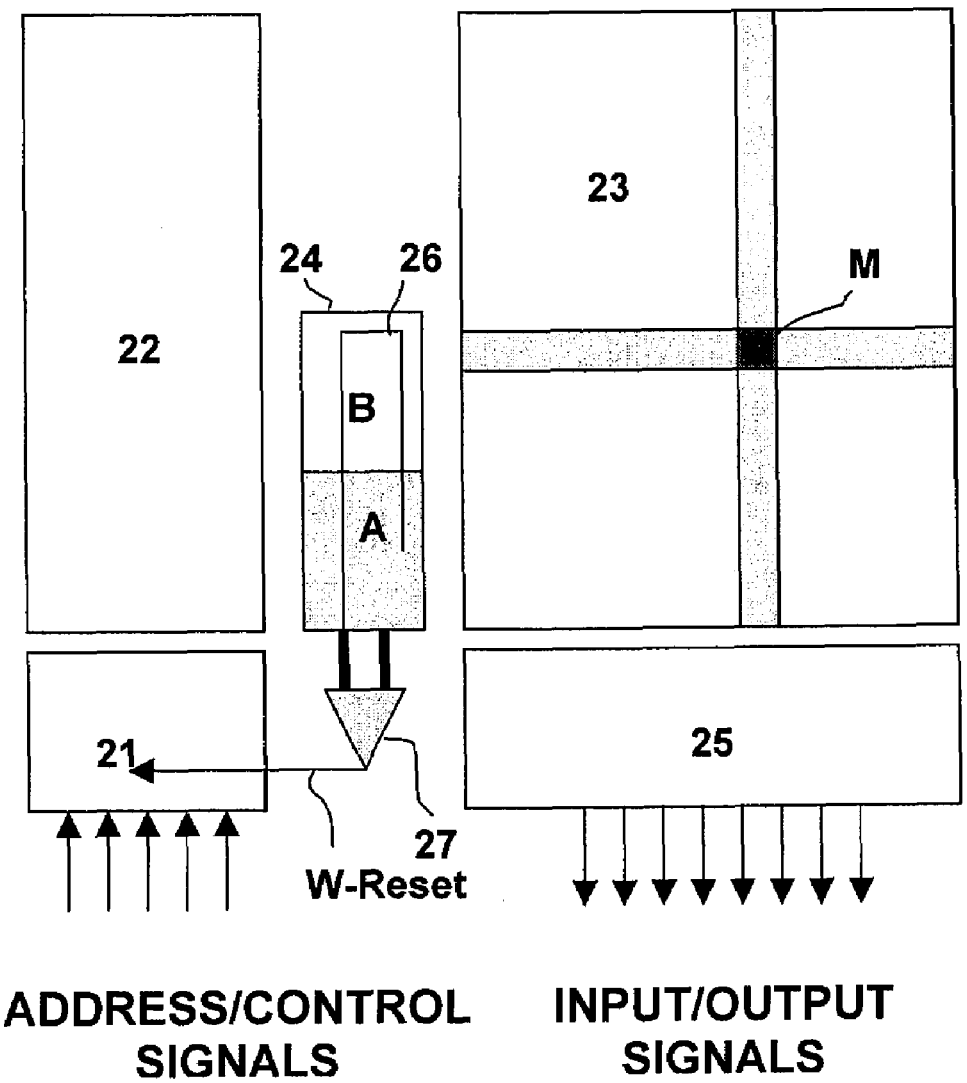
FIG. 2 shows a block diagram of the semiconductor memory device according to one embodiment of the present invention.

In the block diagram as shown in FIG. 2, the dummy column (24) has half the number of rows present in the normal memory array (23). A block of N dummy cells is meant for dummy writing. The rest of the cells in dummy column e.g., 'half the number of rows in normal memory array—N' are kept as load for the dummy bit line (26).

If writing on the dummy cells is started from the rare end, maximum resistive load can be achieved on the dummy bit line. Similarly, if writing is started from the starting end of the dummy bit line, minimum resistive load on dummy bit line is achieved. Therefore in the present configuration, the load on the dummy bit line can be altered as per requirement. In the block diagram as shown in FIG. 2, data writing in dummy cell starts from its rare end.

The position of block A can be chosen at any location in the dummy column (24). Time taken for dummy writing when the dummy bit line turns back from half for writing dummy data from rare end is same as time taken at worst location in entire memory array. This holds true irrespective of the location of the block A in the dummy column (24).

In this write self timing architecture, since dummy write is performed on dummy memory cells which have same structure as that of normal memory cells, therefore, the effect of change in PVT (pressure voltage and temperature) conditions affects actual write path and dummy write path in a similar way. Moreover, RC variation on normal bit line is perfectly matched with the RC variation on dummy bit line. In order to match RC variation on normal word line with that on dummy word line, a row of dummy cells may be incorporated in the memory core. However, this is not required since timing of a write operation is governed by bit line discharge and not by word line selection. Nonetheless, this configuration may be used if perfect matching of RC variation on normal word line and dummy word line is required in a memory design.

Since, in the present architecture, dummy writing is done on many dummy cells therefore the memory is more stable and robust because of averaging effect of device mismatch on dummy memory cells. If standard deviation of a memory cell at some PVT is 'S', them standard deviation of 'N' memory cells in block A would be 'S'/sqrt (N). This makes write self timing less prone to device mismatch.

The dummy memory cells have a load due to W-reset logic generation circuit. In the present self timing architecture, writing on N dummy cells reduces this load by a factor of N since the load is shared by all dummy cells in the block A. This makes dummy memory cell behavior closer to actual memory cell hence increasing the robustness of he write operation.

An additional advantage of this circuitry is that the same input/output block and clock can be used to write on dummy cells as well as normal cells. Hence, as a result of this sharing of devices, robustness of the circuit increases.

It is to be understood that the above described configurations are only illustrative of the application of the principles of the present invention. Numerous modifications and alternative configurations may be devised by those skilled in the art without departing from the scope of the present invention, and the appended claims are intended to cover such modifications and arrangements.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A self timing write architecture for semiconductor memory device, the self timing write architecture comprising:
    an array of normal memory cells arranged in rows and columns;
    at least one column of dummy cells, each column divided into two blocks of dummy cells to write data and to provide load respectively;
    a write circuitry enabled by a write enable signal to carry out memory write operation; and
    at least one logic circuit coupled to said dummy column to signal completion of writing into said dummy cells.

2. The self timing write architecture for semiconductor memory device as claimed in claim 1 wherein internal nodes of said dummy cells to write data are shorted.

3. The self timing write architecture for semiconductor memory device as claimed in claim 1 wherein time taken by said dummy cells to stabilize after writing is same as time taken by said normal memory cells.

4. The self timing write architecture for semiconductor memory device as claimed in claim 1 wherein a number of rows in said dummy column is half that of in said array of normal memory cells.

5. The self timing write architecture for semiconductor memory device as claimed in claim 1 wherein said block of dummy cells to write data has at least one dummy cell having a same structure as at least one of said normal memory cells.

6. The self timing write architecture for semiconductor memory device as claimed in claim 1 wherein said block of dummy cells to write data can be located at any position in said dummy column.

7. A method for providing self timing write architecture for semiconductor memory device, the method comprising:
    arranging normal memory cells in an array of rows and clusters;
    providing at least one column of dummy cells, each column divided into two blocks of dummy cells for data writing and for providing load respectively;
    generating a dummy word line for enabling dummy cells in response to a write enable signal;
    making a dummy bit line travel a number of rows equal to half a number of rows in said array of normal memory cells and then back;
    writing data in all of said dummy cells for data writing;
    simultaneously accessing a normal memory cell and writing actual data into it;
    signaling completion of write operation when all written dummy cells stabilize; and
    starting a recovery operation for a next cycle.

8. The method for providing self timing write architecture for semiconductor memory device as claimed in claim 7 wherein binary 1 or 0 dummy data is written in all of said dummy cells for data writing.

9. The method for providing self timing write architecture for semiconductor memory device as claimed in claim 7 wherein any dummy cells which are not used for writing provide load.

10. The method for providing self timing write architecture for semiconductor memory device as claimed in claim 7 wherein dummy data writing is started from a starting end of the dummy bit line.

11. The method for providing self timing write architecture for semiconductor memory device as claimed in claim 7 wherein dummy data writing is started from a rare end of the dummy bit line.

12. A self timing write architecture for a semiconductor memory device, the self timing write architecture comprising:
   an array of memory cells arranged in rows and columns;
   at least one column of dummy cells, each column divided into a first block of dummy cells to write data and a second block of dummy cells to provide load;
   a write circuitry coupled to the array of memory cells and to said at least one column of dummy cells, said write circuitry being responsive to a write enable signal to cause a dummy bit line to travel a number of rows corresponding to less than a number of all rows in said array of memory cells and then back, said write circuitry further being responsive to the write enable signal to subsequently carry out a write operation in all of said dummy cells of the first block and simultaneously in at least one of said memory cells; and
   at least one logic circuit coupled to said at least one column of dummy cells to signal completion of said write operation.

13. The architecture of claim 12 wherein said number of rows corresponding to less than the number of all rows in said array of memory cells is half the number of all rows in said array of memory cells.

14. The architecture of claim 12 wherein said write operation carried out in all of said dummy cells of the first block results in an averaging out in variation in behavior of dummy cells due to process variations.

15. The architecture of claim 12 wherein internal nodes of said dummy cells in the first block are shorted.

16. The architecture of claim 12 wherein said at least one logic circuit is adapted to signal the completion of said write operation based on time taken by said dummy cells of the first block to stabilize after writing, said time being same as time taken by said memory cells to stabilize.

17. The architecture of claim 12 wherein said at least one column of dummy cells has fewer rows than said array of memory cells.

18. A method for providing a self timing write architecture for semiconductor memory device, the method comprising:
   arranging memory cells in an array of rows and columns;
   providing at least one column of dummy cells, each column divided into two blocks of dummy cells for data writing and for providing load respectively;
   making a dummy bit line travel a number of rows equal to less than a number of rows in said array of memory cells and then back;
   writing data in all of said dummy cells for data writing after said dummy bit line has traveled back, and simultaneously writing data into one of said memory cells in the array; and
   signaling completion of said writing in the dummy cells after all written dummy cells stabilize.

19. The method of claim 18 wherein the bit line has first end and a second end distal from the first end, and wherein writing data into the dummy cells begins at said first end of said bit line.

20. The method of claim 18 wherein the bit line has first end and a second end distal from the first end, and wherein writing data into the dummy cells begins at said second end of said bit line.

21. The method of claim 18 wherein making said dummy bit line travel the number of rows equal to less than the number of rows in said array of memory cells includes making said dummy bit line travel half the number of rows in said array of memory cells.

22. The method of claim 18, further comprising shorting out internal nodes of said dummy cells for writing data.

23. The method of claim 18, further comprising averaging out variation in behavior of dummy cells due to process variations.

24. A system for providing a self timing write capability for a semiconductor memory device, the system comprising:
   an array of memory cells arranged in rows and columns;
   means for writing data into all cells of a first block of dummy cells and for providing load using a second block of dummy cells, said first and second blocks of dummy cells belonging to at least one column of dummy cells;
   means for making a dummy bit line travel a number of rows equal to less than a number of rows in said array of memory cells and then back;
   wherein said means for writing data in all cells of said first block of dummy cells writes the data after said dummy bit line has traveled back and simultaneously with a writing of data into one of said memory cells in the array; and
   means for signaling completion of said writing in the dummy cells after all written dummy cells stabilize.

25. The system of claim 24, further comprising:
   means for generating a dummy word line to enable dummy cells in response to a write enable signal; and
   means for starting a recovery operation for a next cycle, in response to said signaling of completion of said writing in the dummy cells.

26. The system of claim 24, further comprising means for locating said first block at any location in said at least one column of dummy cells.

27. The system of claim 24, further comprising input/output block means for enabling the writing data in all cells of said first block of dummy cells.

* * * * *